(12) United States Patent
Ando

(10) Patent No.: US 7,773,428 B2
(45) Date of Patent: Aug. 10, 2010

(54) NONVOLATILE SEMICONDUCTOR MEMORY HAVING SUITABLE CRYSTAL ORIENTATION

(75) Inventor: Koichi Ando, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 70 days.

(21) Appl. No.: 12/000,425

(22) Filed: Dec. 12, 2007

(65) Prior Publication Data

US 2008/0144394 A1 Jun. 19, 2008

(30) Foreign Application Priority Data

Dec. 15, 2006 (JP) ............................. 2006-338798

(51) Int. Cl.
*G11C 16/04* (2006.01)
(52) U.S. Cl. .............................. 365/185.26; 356/185.1; 356/185.27; 356/185.28
(58) Field of Classification Search ............ 365/185.27, 365/185.18, 185.09, 226, 185.26, 185.1, 365/185.28
See application file for complete search history.

(56) References Cited

U.S. PATENT DOCUMENTS 5,477,068 A * 12/1995 Ozawa ....................... 257/214
6,456,557 B1 * 9/2002 Dadashev et al. ........... 365/226
6,870,765 B2 * 3/2005 Fujiwara ................. 365/185.02
6,894,924 B2 * 5/2005 Choi et al. .............. 365/185.01

FOREIGN PATENT DOCUMENTS

JP 2001-512290 8/2001
JP 2002-305291 10/2002

OTHER PUBLICATIONS

Yutaka Hayashi, Seiki Ogura, Tomoya Saito, and Tomoko Ogura, "Twin MONOS Cell with Dual Control Gates", 2000 Symposium on VLSI Technology Digest of Technical Papers, pp. 122-123, 2000.

* cited by examiner

*Primary Examiner*—Pho M. Luu
(74) *Attorney, Agent, or Firm*—McGinn IP Law Group, PLLC

(57) ABSTRACT

An NMOS transistor type nonvolatile semiconductor memory has first and second N-type diffusion layers formed in a P-type silicon layer as a source and a drain; a gate electrode formed on a channel region with an insulating film interposed therebetween, the channel region being sandwiched between the first and second N-type diffusion layers; and a charge storage layer formed in the insulating film. A direction from the first N-type diffusion layer to the second N-type diffusion layer is the same as a crystal orientation <100> of the P-type silicon layer. At the time of rewriting, the hot holes go over a potential barrier of the insulating film to be injected into the charge storage layer.

15 Claims, 5 Drawing Sheets

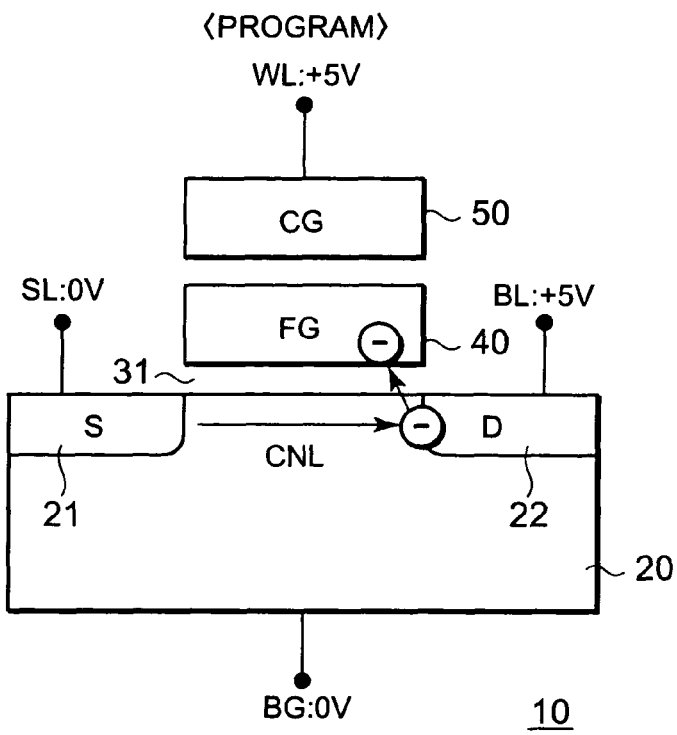
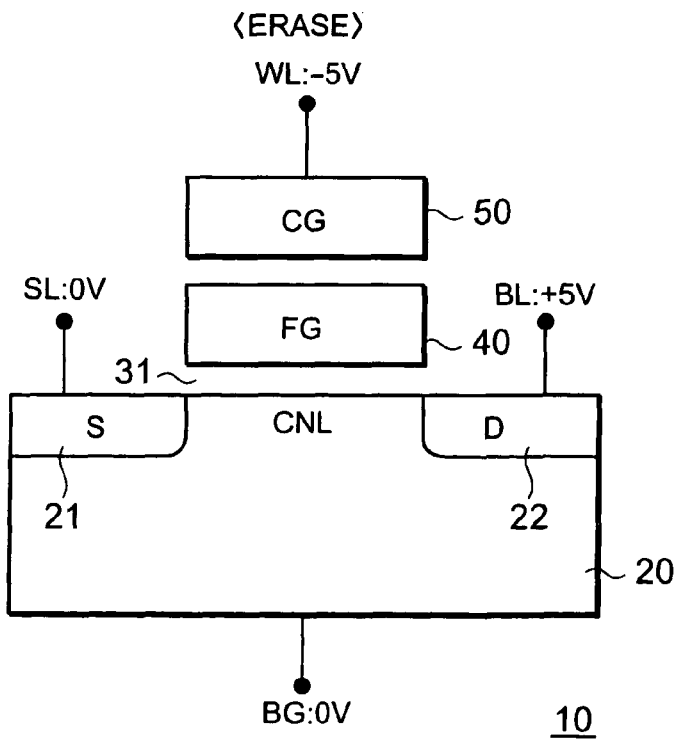

NONVOLATILE SEMICONDUCTOR MEMORY HAVING SUITABLE CRYSTAL ORIENTATION

BACKGROUND OF THE INVENTION

1. Field of the Invention

The present invention relates to a nonvolatile semiconductor memory. In particular, the present invention relates to an NMOS transistor type nonvolatile semiconductor memory.

2. Description of Related Art

Electrically erasable and programmable nonvolatile semiconductor memories such as flash memories are known. Typically, a memory cell of such nonvolatile semiconductor memories has a structure of an NMOS transistor. More specifically, an NMOS transistor type nonvolatile memory cell includes a "charge storage layer" which is provided between a gate electrode (control gate) and a P-type semiconductor substrate. As examples of the charge storage layer, a floating gate or a nitride film of an ONO (Oxide Nitride Oxide) film are used. A threshold voltage of the NMOS transistor type nonvolatile memory cell varies depending on the amount of charges stored in the charge storage layer. Use of this variation of the threshold voltage allows the nonvolatile memory cell to nonvolatily store data.

There is known a technique (HHI: Hot Hole Injection) of injecting hot holes to the charge storage layer in order to lower the threshold voltage of the NMOS transistor type nonvolatile memory cell. Yutaka Hayashi, Seiki Ogura, Tomoya Saito, and Tomoko Ogura, "Twin MONOS Cell with Dual Control Gates", 2000 Symposium on VLSI Technology Digest of Technical Papers, pp. 122-123, 2000 discloses a technique that a "Band-to-Band tunnel phenomenon" causes hot holes near an N-type diffusion layer. Then, the hot holes having high energy go over a potential barrier of an oxide film in the ONO film to be injected into a nitride film in the ONO film. The Hot Hole Injection is also referred to in Japanese Patent Laid Open Publication No. 2001-512290.

In general, a nonvolatile semiconductor memory is formed on a silicon wafer. On the silicon wafer, a crystal plane (100) of a silicon crystal is set as a surface on which an NMOS transistor type nonvolatile memory cell is formed. This is because the interface state between the silicon and the oxide film is the smallest in the case of the crystal plane (100). In addition, the nonvolatile semiconductor memory is generally formed along a crystal orientation <110>. This is because it is easiest to cut the silicon wafer along the crystal orientation <110> from the view point of a cleavage property when rectangular devices are cut from the silicon wafer. Thus, a channel direction of the nonvolatile memory cell is generally congruent with a crystal orientation <110> of the silicon.

Japanese Patent Application Laid-open Publication No. 2002-305291 discloses a technique relating to a crystal plane and crystal orientation of a silicon wafer. More specifically, in '291 publication, there is disclosed a technique for reducing metallic contamination in an SOI (Silicon On Insulator) substrate when devices are manufactured on the SOI substrate. According to the technique, a base substrate and a bond substrate, on the latter of which the devices are to be formed, are firstly prepared in order to form the SOI substrate. Both of the base substrate and the bond substrate are single crystal silicon wafers whose principal surfaces are crystal planes (100). Within the surface of the base substrate, notches are formed in a crystal orientation <011>, whereas within the surface of the bond substrate, notches are formed in a crystal orientation <010>. The base substrate and the bond substrate are bonded via an oxide film in such a manner that these notches overlap each other. Thus, the SOI substrate is created. In this manner, the base substrate and the bond substrate are bonded so as to have different crystal orientations. As a result, the gettering ability of the SOI substrate is improved. A device such as a flash memory is formed on the SOI substrate so that a longitudinal direction thereof would be parallel or vertical to the crystal orientation <010> of the bond substrate. Thus, the gettering ability of the SOI substrate is improved and the metallic contamination is suppressed, so that reliability of the device is improved.

SUMMARY OF THE INVENTION

According to an aspect of the present invention, a nonvolatile semiconductor memory includes first and second N-type diffusion layers formed in a P-type silicon layer as a source and a drain; a gate electrode formed on a channel region with an insulating film interposed therebetween, the channel region sandwiched between the first and second N-type diffusion layers; and a charge storage layer formed in the insulating film between the channel region and the gate electrode. A direction from the first N-type diffusion layer to the second N-type diffusion layer is the same as a crystal orientation <100> of the P-type silicon layer.

According to the aspect of the present invention, an HHI method is employed to lower a threshold voltage of the nonvolatile memory cell. Specifically, at the time of rewriting data, a negative potential relative to a potential of the P-type silicon layer is applied to the gate electrode, and a positive potential relative to a potential of the P-type silicon layer is applied to at least one of the first and second N-type diffusion layers. At this time, since an intense electric field is applied to a depletion layer in a circumference of an end portion of the N-type diffusion layer, the Band-to-Band Tunnel phenomenon occurs due to the intense electric field. As a result, an electron-positive hole pair is generated in the depletion layer. Among these, positive holes are attracted to the channel region side by the electric filed in the depletion layer. At that time, the holes are accelerated by the electric filed to become hot holes. In this manner, in the depletion layer mainly on the channel region side, a large number of hot holes are generated. Then, these hot holes are attracted by the negative potential of the gate electrode and are injected to the charge storage layer by going over a potential barrier of the insulating film.

Here, it is to be noted that in the present invention, a channel direction, that is, a direction to which carriers flow is the same as the crystal orientation <100>. In the case of a silicon crystal, mobility of the holes along the crystal orientation <100> is larger than that of a crystal orientation <110>. Accordingly, the holes are more easily accelerated in the depletion layer and energy is more easily obtained. That is, in the rewriting of the data based on the above-described HHI, the efficiency of generating the hot holes is improved and the efficiency of injecting the hot holes to the charge storage layer is improved.

Since the efficiency of injecting the hot holes to the electric charge layer is improved, the time required for rewriting the data is reduced. That is, the operating speed of the nonvolatile semiconductor memory is improved. Or, since the efficiency of injecting the hot holes to the charge storage layer is improved, the HHI can be achieved by applying a lower potential. That is, data can be rewritten by the application of a lower potential. In this case, an area of a peripheral circuit such as a charge pump circuit can be reduced.

According to a nonvolatile semiconductor memory of the present invention, an operating speed is improved. In addition, data can be rewritten by the application of a lower potential, and an area of a peripheral circuit can be reduced.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 3 is a schematic view showing a programming operation according to the exemplary embodiment of the present invention;

FIG. 4 is a schematic view showing an erasing operation according to the exemplary embodiment of the present invention;

DETAILED DESCRIPTION OF THE EXEMPLARY EMBODIMENT

Referring to the accompanying drawings, a nonvolatile semiconductor memory according to one exemplary embodiment of the present invention will be described below. The nonvolatile semiconductor memory according to the present embodiment is mounted on, for example, a microcomputer.

1. STRUCTURE

Figure 1:
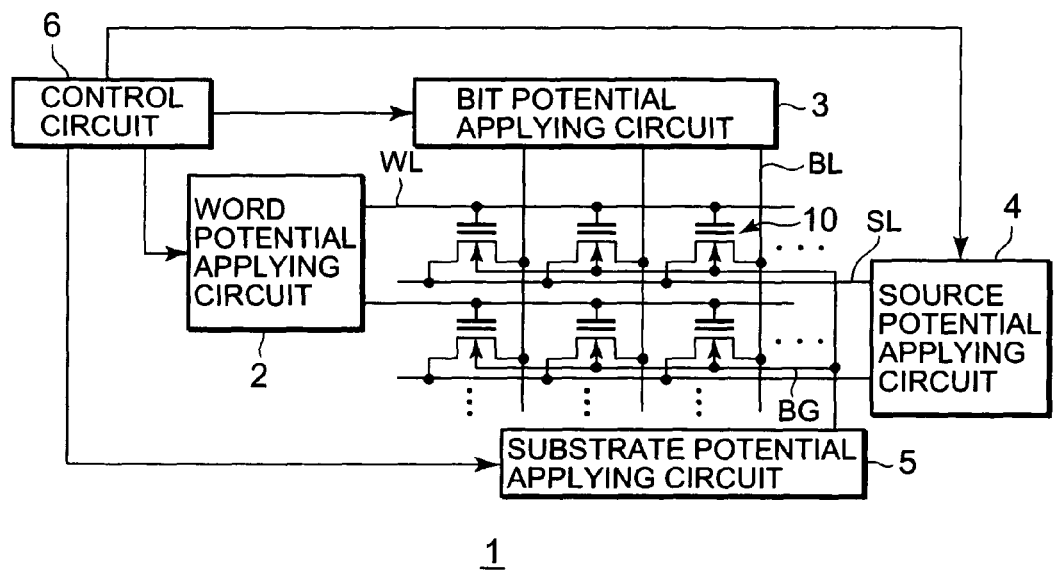
FIG. 1 is a schematic view showing one example of configurations of a nonvolatile semiconductor memory according to one exemplary embodiment of the present invention.

FIG. 1 is a schematic view showing one example of configurations of a nonvolatile semiconductor memory 1 according to the present embodiment. The nonvolatile semiconductor memory 1 is provided with a word potential applying circuit 2, a bit potential applying circuit 3, a source potential applying circuit 4, a substrate potential applying circuit 5, a control circuit 6, and a plurality of nonvolatile memory cells 10 arranged in an arrayed state.

Each nonvolatile memory cell 10 is able to electrically erase and program data. Specifically, each nonvolatile memory cell 10 has an NMOS transistor type structure, including a gate electrode (a control gate), a source, a drain, and a back gate. The gate electrode is connected to a word line WL, and the back gate is connected to a back gate line BG. The drain is connected to a bit line BL, and the source is connected to a source line SL.

The word potential applying circuit 2 applies a predetermined word potential corresponding to an operation to a selected word line WL. That is, the word potential applying circuit 2 applies a predetermined word potential to a gate electrode of the selected nonvolatile memory cell 10. The bit potential applying circuit 3 applies a predetermined bit potential corresponding to an operation to a selected bit line BL. That is, the bit potential applying circuit 3 applies a predetermined bit potential to a drain of the selected nonvolatile memory cell 10. The source potential applying circuit 4 applies a predetermined source potential corresponding to an operation to a selected source line SL. That is, the source potential applying circuit 4 applies a predetermined source potential to a source of the selected nonvolatile memory cell 10. The substrate potential applying circuit 5 applies a predetermined substrate potential corresponding to an operation to the back gate line BG, that is, the back gate of each nonvolatile memory cell 10.

The control circuit 6 designates each of the word potential applying circuit 2, the bit potential applying circuit 3, the source potential applying circuit 4, and the substrate potential applying circuit 5 to apply a potential corresponding to an operation. That is, it can be said that each of the word potential applying circuit 2, the bit potential applying circuit 3, the source potential applying circuit 4, the substrate potential applying circuit 5, and the control circuit 6 constitute a "potential applying unit" for applying a predetermined potential to a selected nonvolatile memory cell 10.

Figure 2:
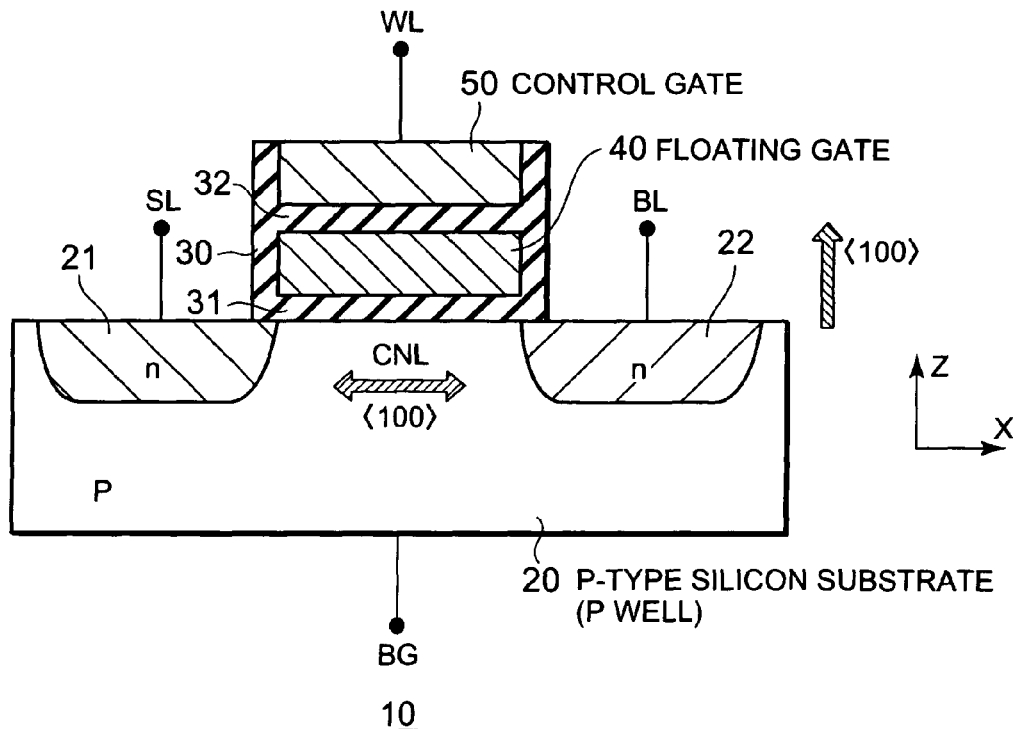
FIG. 2 is a cross-sectional view showing a structure of a nonvolatile memory cell according to the exemplary embodiment of the present invention.

FIG. 2 is a cross-sectional view showing a structure of the nonvolatile memory cell 10 according to the present embodiment. This nonvolatile memory cell 10 has an NMOS transistor type structure. Specifically, first and second N-type diffusion layers 21 and 22 functioning as a source and a drain are formed in a P-type silicon substrate (or a P-type well) 20. A region sandwiched between the first and second N-type diffusion layers 21 and 22 in the P-type silicon substrate 20 is a channel region CNL where a channel is formed. For example, the first N-type diffusion layer 21 is connected to the above-mentioned bit line BL and the second N-type diffusion layer 22 is connected to the above-mentioned source line SL. Furthermore, a predetermined substrate potential is applied to the P-type silicon substrate 20 through the above-mentioned back gate line BG.

On the channel region CNL, a floating gate 40 is formed via a first gate insulating film 31. Furthermore, on the floating gate 40, a control gate 50 is formed via a second gate insulating film 32. The control gate 50 is connected to the above-mentioned word line WL. The floating gate 40 is surrounded by the insulating film 30 including the first and second gate insulating films 31 and 32 so as to be electrically isolated from the surrounding components. That is, the floating gate 40 is formed in the insulating film 30 between the channel region CNL and the control gate 50.

The floating gate 40 functions as the "charge storage layer" in which charges are stored. A threshold voltage of the NMOS transistor type nonvolatile memory cell 10 varies depending on the amount of charges stored in the floating gate 40. The variation of the threshold voltage is utilized, so that the nonvolatile memory cell 10 can nonvolatily store data (0 or 1). In this sense, the floating gate 40 can also be referred to as a "data storage region". On the other hand, the control gate 50 is a gate electrode arranged on the data storage region, and functions to perform control of changing or detecting a state of the data storage region.

In FIG. 2, a direction perpendicular to a surface of the P-type silicon substrate 20 is defined as a direction Z. That is, the surface of the P-type silicon substrate 20 is parallel to a plane X-Y. In addition, a direction from the first N-type diffusion layer 21 to the second N-type diffusion layer 22 is defined as a direction X. That is, the channel region CNL is formed along the direction X. According to the present embodiment, the nonvolatile memory cell 10 is formed so that the direction X (the channel direction) would be a specific direction as mentioned below.

Since the P-type silicon substrate 20 is formed of silicon crystals, a crystal orientation (<100>, <110>, or the like) and a crystal plane ((100), (110), or the like) can be defined. The crystal orientation and crystal plane can be measured by an X-ray diffraction experiment using, for example, a Cu—Kα line. In the present embodiment, the surface of the P-type silicon substrate 20 (the plane XY) is a crystal plane (100), and the direction Z is congruent with a crystal orientation <100>. Furthermore, according to the present embodiment, the direction X is also congruent with the crystal orientation <100>. That is, the direction from the first N-type diffusion layer 21 to the second N-type diffusion layer 22, or a direction from the second N-type diffusion layer 22 to the first N-type diffusion layer 21 are the same as the crystal orientation <100> of the silicon crystal. It is to be noted that the crystal orientation <100> can also be expressed as a crystal orientation <010> or a crystal orientation <001>. In addition, a crystal plane (110) can be shown as a crystal plane (010) or a crystal plane (001).

In a general MOS transistor, a channel direction is the same as a crystal orientation <110>. However, according to the present embodiment, the channel direction (the direction X) is the same as the crystal orientation <100>. It is known that an effective mass of the positive holes along the crystal orientation <100> is smaller than that along the crystal orientation <110>. That is, the mobility of the positive holes along the crystal orientation <100> is larger than that along the crystal orientation <110>. For this reason, according to the present embodiment, the mobility of holes along the direction X is improved as compared with the general MOS transistor. On the other hand, with regard to electrons, it is known that there is hardly any difference in the mobility between the crystal orientation <100> and the crystal orientation <110>. Thus, according to the present embodiment, the mobility of electrons along the channel direction (the direction X) is hardly changed.

2. OPERATION

Next, the detailed description will be given for operations of rewriting and reading data of the nonvolatile semiconductor memory 1 according to the present embodiment. At the time of the data rewriting and the data reading operations, the above-mentioned potential applying unit applies, to a selected nonvolatile memory cell 10, a potential corresponding to each of the operations. It is to be noted that the "data rewriting operation" includes a "programming operation" and an "erasing operation". In the following description, an operation to provide a larger threshold voltage is referred to as a "programming operation", whereas an operation to provide a smaller threshold voltage is referred to as an "erasing operation". However, to allocate the operations is a matter of design, and the allocation of the operations may be reversed.

2-1. Programming Operation

At the time of performing a programming operation, one nonvolatile memory cell 10 which is a target to be programmed is selected. Data programming in the selected nonvolatile memory cell 10 can be achieved by a CHE (Channel Hot Electron) method.

FIG. 3 is a schematic view showing one example of the programming operation. As shown in FIG. 3, the potential applying unit applies potentials of +5 V, 0 V, +5 V, and 0 V to the control gate (CG) 50, the first N-type diffusion layer 21, the second N-type diffusion layer 22, and the P-type silicon substrate 20, respectively. At this time, the first N-type diffusion layer 21 functions as a source and the second N-type diffusion layer 22 functions as a drain. Channel electrons are accelerated by the intense electric field near the drain to be made channel hot electrons (CHE). One portion of the generated channel hot electrons go over a potential barrier of the gate insulating film 31 to be injected to the floating gate (FG) 40. As a result, a threshold voltage of the NMOS transistor type nonvolatile memory cell 10 increases.

2-2. Erasing Operation

At the time of performing an erasing operation, data of all the nonvolatile memory cells 10, which are included in a certain block, are erased at once. In the present embodiment, the erasing operation in each of the nonvolatile memory cells 10 is achieved not by an FN (Fowler-Nordheim) tunnel method but by the HHI (Hot Hole Injection) method.

FIG. 4 is a schematic view showing one example of an erasing operation. As shown in FIG. 4, the potential applying unit applies potentials of −5 V, 0 V, +5 V, and 0 V to the control gate 50, the first N-type diffusion layer 21, the second N-type diffusion layer 22, and the P-type silicon substrate 20, respectively. That is, the potential applying unit applies the same potential as that applied to the P-type silicon substrate 20, to the first N-type diffusion layer 21. In addition, the potential applying unit applies a negative potential (−5 V) relative to potentials of the P-type silicon substrate 20 and the first N-type diffusion layer 21 (0 V) to the control gate 50. Furthermore, the potential applying unit applies a positive potential (+5 V) relative to potentials of the P-type silicon substrate 20 and the first N-type diffusion layer 21 (0 V) to the second N-type diffusion layer 22. At this time, since the nonvolatile memory cell 10 is an NMOS transistor type, the channel does not become conductive.

Figure 5:
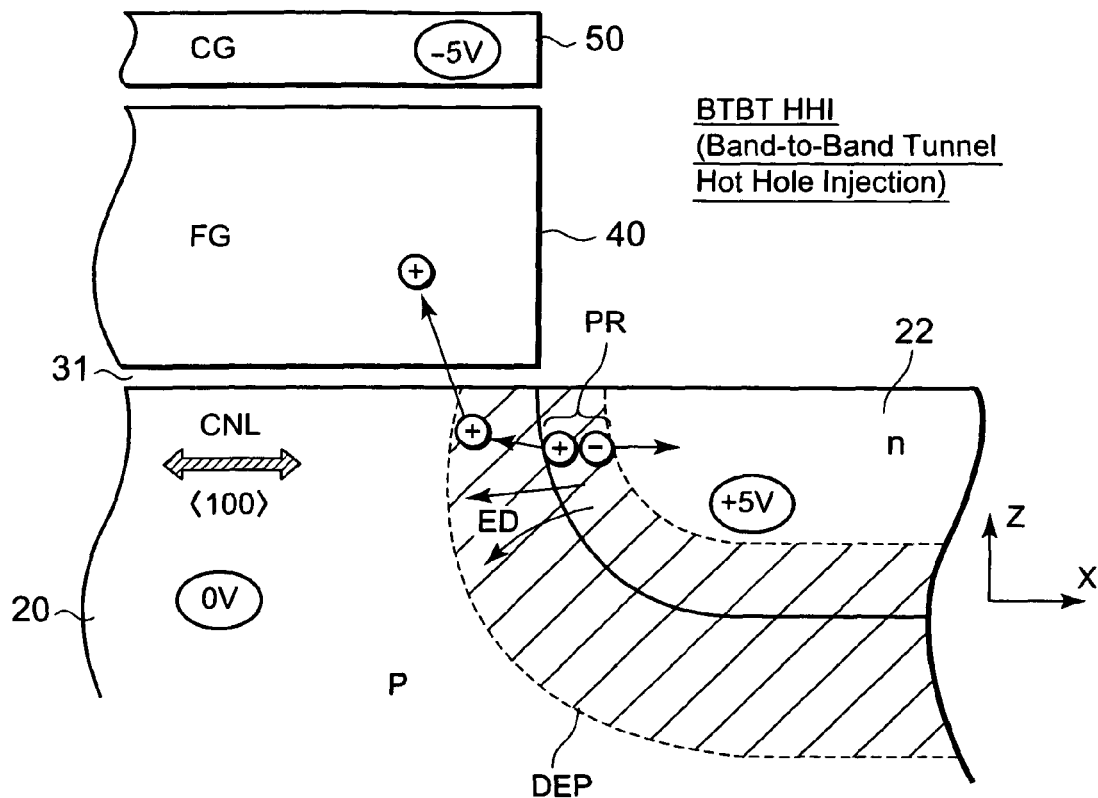
FIG. 5 is a schematic view showing a Band-to-Band Tunnel Hot Hole Injection (BTBTHHI) in the exemplary embodiment of the present invention.

FIG. 5 is an enlarged view showing a circumference of the second N-type diffusion layer 22 at the time of performing the erasing operation. As described above, the potential of the control gate 50 is −5 V, the potential of the second N-type diffusion layer 22 is +5 V, and the potential of the P-type silicon substrate 20 is 0 V. At this time, in the circumference of the end portion of the second N-type diffusion layer 22, a depletion layer DEP is formed. In addition, there is a big difference between the potential of the control gate 50 (−5 V) and the potential of the second N-type diffusion layer 22 (+5 V), so that an intense electric field ED is applied to the depletion layer DEP in the circumference of the end portion of the second N-type diffusion layer 22.

At this time, the intense electric field ED generates a "band-to-band tunnel phenomenon", and as shown in FIG. 5, this band-to-band tunnel phenomenon generates electron-positive hole pairs PR in the depletion layer DEP where carriers usually do not exist. In particular, the electron-positive hole pairs PR are often generated in the end portion of the second N-type diffusion layer 22. In the electron-positive hole pair PR, electrons are attracted towards the second N-type diffusion layer 22 (+5 V). In contrast, the positive holes (holes) of the electron-positive hole pair PR are attracted towards the channel region CNL by the electric field ED in the depletion layer DEP. At this time, the holes are accelerated by the electric field ED in the depletion layer DEP and become hot holes. In this manner, the band-to-band tunnel phenomenon generates the hot hole (Band-to-Band Tunnel Hot Hole). In particular, in the depletion layer DEP on the channel region CNL side, a large number of hot holes are generated. It is to be noted that the generated hot holes have a possibility of generating another electron-positive hole pair PR by colliding to a lattice. If the number of annihilated electron-positive hole pairs is smaller than the number of the generated electron-positive hole pairs, an avalanche breakdown occurs. This avalanche breakdown also causes a large number of hot carriers (hot holes, hot electrons).

In this manner, according to the present embodiment, the band-to-band tunnel phenomenon and the avalanche breakdown cause a large number of hot holes in the depletion layer DEP and the channel region CNL. These hot holes are attracted to a negative potential (−5 V) of the control gate 50. Then, the hot holes having a high energy go over the potential barrier of the gate insulating film 31 to be injected to the floating gate 40 (BTBTHHI: Band-to-Band Tunnel Hot Hole Injection). As a result, the threshold voltage of the NMOS transistor type nonvolatile memory cell 10 decreases.

2-3. Reading Operation

Figure 6:
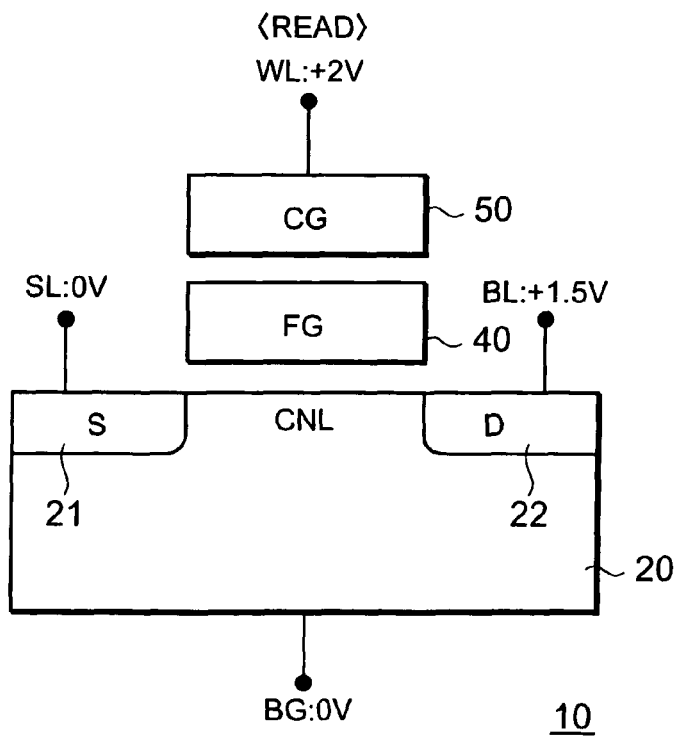
FIG. 6 is a schematic view showing a reading operation according to the exemplary embodiment of the present invention.

FIG. 6 is a schematic view showing one example of a reading operation. As shown in FIG. 6, the potential applying unit applies potentials of +2 V, 0 V, +1.5 V, and 0 V to the control gate 50; the first N-type diffusion layer 21, the second N-type diffusion layer 22, and the P-type silicon substrate 20, respectively. At this time, the first N-type diffusion layer 21 functions as a source and the second N-type diffusion layer 22 functions as a drain. In a programming state with a high threshold voltage, the NMOS transistor is turned off and in an erasing state with a low threshold voltage, the NMOS transistor is turned on. By detecting these on and off states, the data stored in the nonvolatile memory cell 10 can be read out.

3. EFFECTS

According to the present embodiment, in the erasing operation, not the FN tunnel method but the BTBTHHI method is employed. The effects obtained from this are as follows.

In a case of the FN tunnel method, an extremely high potential (10 V or more) needs to be applied to the control gate 50 to cause an FN tunnel current to flow through. A circuit for generating such a high applying potential becomes inevitably large. In contrast, according to the present embodiment, for both of the programming and the erasing operations, not the FN tunnel current but the hot carrier (channel hot electron, hot hole) is utilized. When compared with the FN tunnel method, the injection of the hot carriers can be achieved by the application of a smaller potential. That is, by using the BTBTHHI method, data can be erased by the application of a lower potential. Thus, it becomes possible to reduce the size of a circuit, such as a charge pump circuit, for generating an applying potential.

Furthermore, according to the present embodiment, the channel direction (the direction X), that is, a direction to which the carriers flow is the same as a crystal orientation <100> of silicon. This is different from a general MOS transistor whose channel direction is the same as a crystal orientation <110>. In the case of silicon crystal, the mobility of holes along the crystal orientation <100> is larger than that along the crystal orientation <110>. The effects obtained from this are as follows.

As described above, at the time of performing the erasing operation, the holes generated in the depletion layer DEP by the band-to-band tunnel phenomenon are attracted towards the channel region CNL by the electric field ED in the depletion layer DEP. At this time, the holes are accelerated by the electric field ED to become hot holes. According to the present embodiment, since the channel direction is congruent with the crystal orientation <100>, the holes are more easily accelerated in the depletion layer DEP or the channel region CNL, and more easily obtain energy. That is, the efficiency of generating the hot holes is improved and the efficiency of injecting the hot holes to the floating gate 40 is improved.

Since the efficiency of injecting the hot holes to the floating gate 40 is improved, a time required for erasing data is reduced. That is, the operating speed of the nonvolatile semiconductor memory 1 is improved. Or, since the efficiency of injecting the hot holes to the floating gate 40 is improved, it becomes possible to achieve the BTBTHHI by the application of a lower potential. That is, when compared with a normal BTBTHHI method, data can be erased by the application of an even lower potential. These are synergistic effects obtained by the combination of the BTBTHHI method and the crystal orientation <100>. That is, according to the present embodiment, the synergistic effects which are conventionally impossible to obtain can be made possible.

It is to be noted that at the time of performing the erasing operation, the potential of +5 V may be applied to both of the first N-type diffusion layer 21 and the second N-type diffusion layer 22. In this case, the phenomenon shown in FIG. 5 also occurs near the first N-type diffusion layer 21. As a result, the efficiency of injecting hot holes to the floating gate 40 is further improved, which is favorable.

4. MODIFIED EXAMPLE

Figure 7:
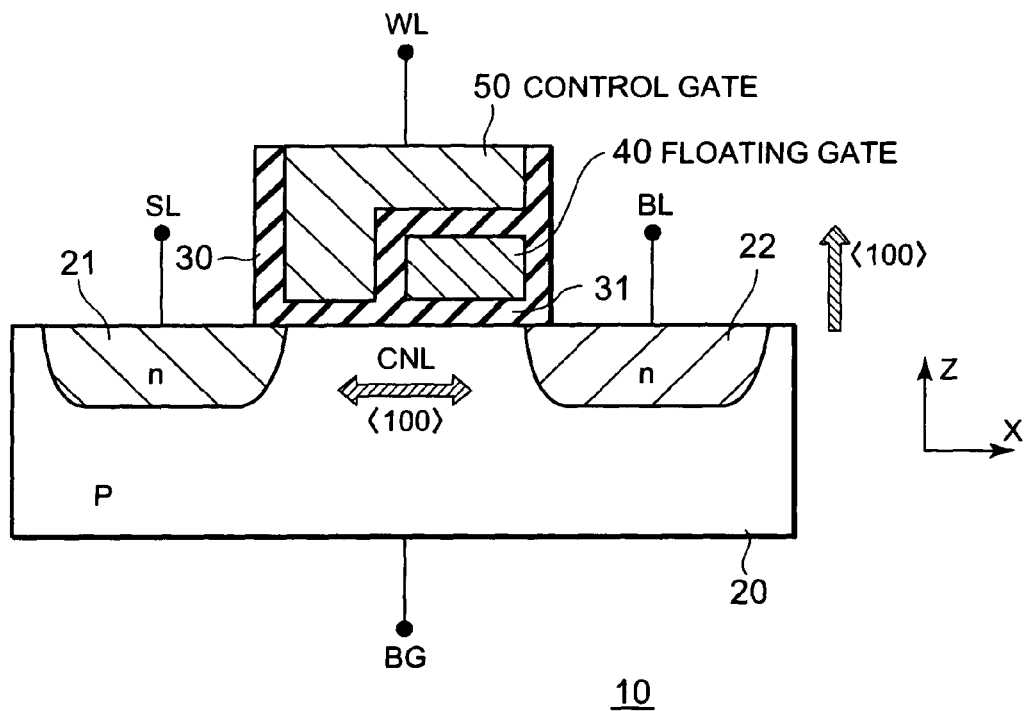
FIG. 7 is a cross-sectional view showing a modified example of the nonvolatile memory cell according to the exemplary embodiment of the present invention.

FIG. 7 shows a modified example of the nonvolatile memory cell 10 according to the present embodiment. The nonvolatile memory cell 10 shown in FIG. 7 has a split gate type structure. That is, the control gate 50 partially overlaps the floating gate 40, and one portion of the control gate 50 is provided on the channel region CNL via the first gate insulating film 31.

Figure 8:
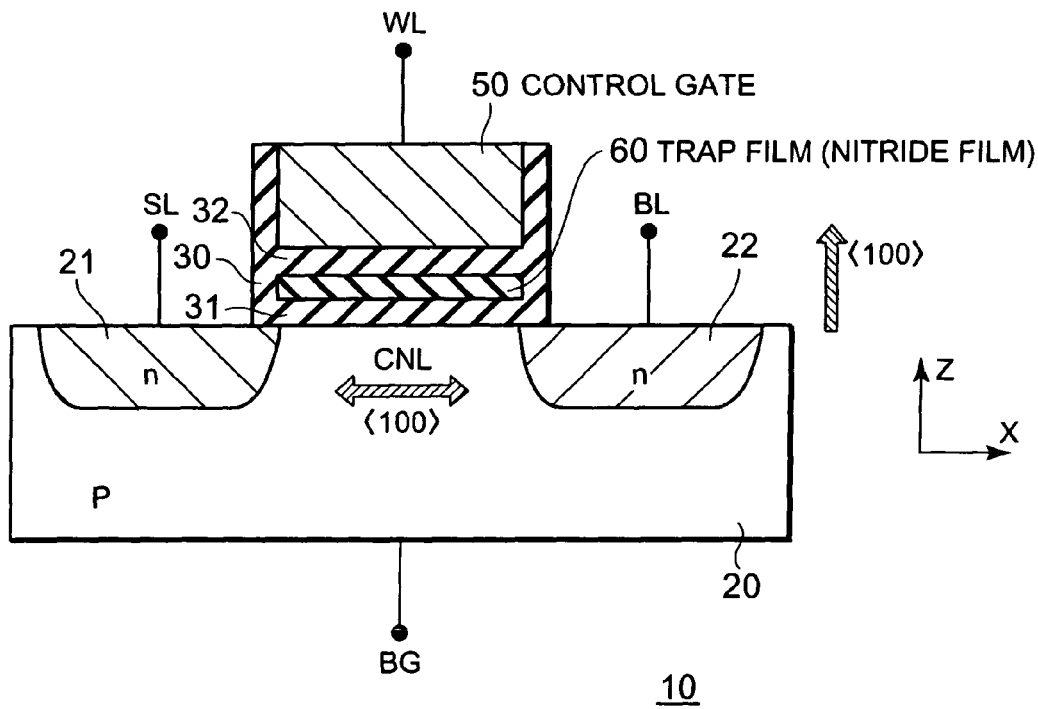
FIG. 8 is a cross-sectional view showing another modified example of the nonvolatile memory cell according to the exemplary embodiment of the present invention.

FIG. 8 shows another modified example of the nonvolatile memory cell 10 according to the present embodiment. In FIG. 8, in place of the floating gate 40, a trap film 60 having a property of trapping electric charges is formed in the insulating film 30. This trap film 60 is, for example, a silicon nitride film. In addition, the first gate insulating film 31 and the second gate insulating film 32 are silicon oxide films. That is, the first gate insulating film 31, the trap film 60, and the second gate insulating film 32 form an ONO (Oxide Nitride Oxide) film. The nonvolatile memory cell 10 shown in FIG. 8 is a so-called "MONOS transistor type". When electrons are trapped in the trap film 60, a threshold voltage of the MONOS transistor becomes larger when compared with the case where they are not trapped. That is, in the present modified example, the trap film 60 functions as a "charge storage layer".

Figure 9:
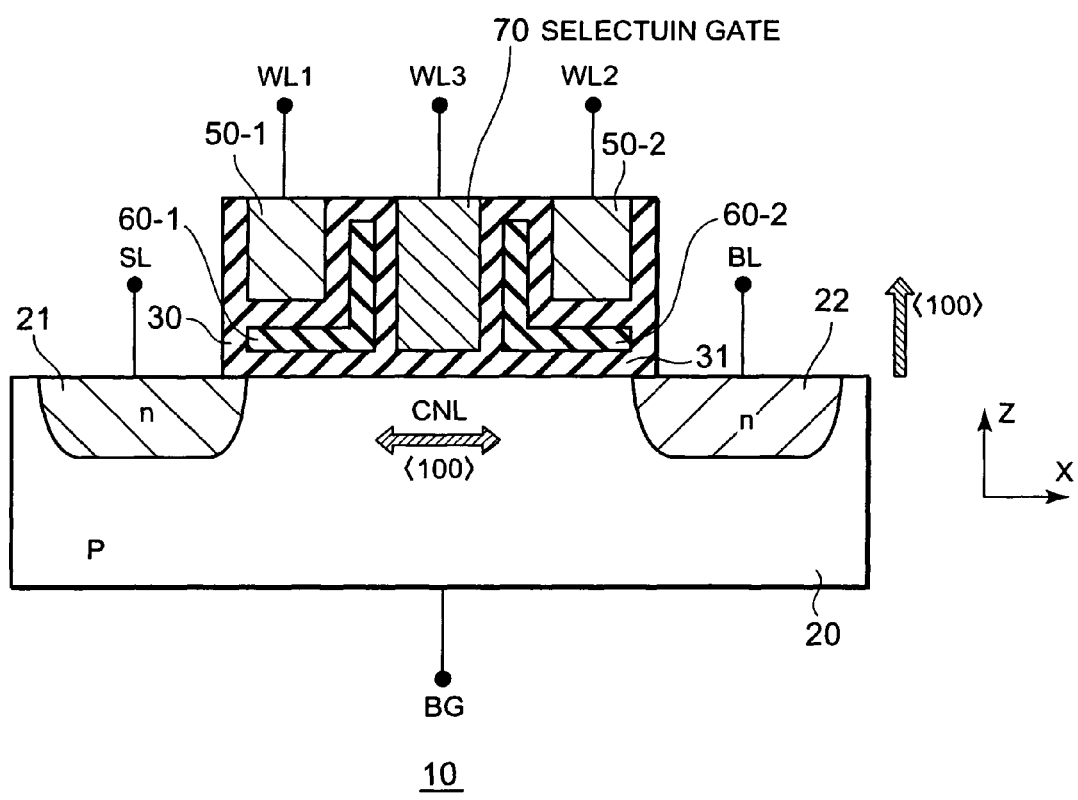
FIG. 9 is a cross-sectional view showing still another modified example of the nonvolatile memory cell according to the embodiment of the present invention.

FIG. 9 shows still another modified example of the nonvolatile memory cell 10 according to the present embodiment. In FIG. 9, MONOS transistors are formed at both sides of a selection gate 70. That is, the nonvolatile memory cell 10 shown in FIG. 9 is a so-called "twin MONOS type" (see Non-patent Document 1). More specifically, the selection gate 70 is formed on the channel region CNL via the gate insulating film 31. On the channel region CNL on both sides of the selection gate 70, first MONOS transistor and second MONOS transistor are formed. The first MONOS transistor has a control gate 50-1 and a trap film 60-1, whereas the second MONOS transistor has a control gate 50-2 and a trap film 60-2. In the present modified example, the trap films 60-1 and 60-2 function as a "charge storage layer".

The control gate 50-1, the control gate 50-2, and the selection gate 70 are connected to word lines WL1, WL2, and WL3, respectively. The selection gate 70 is a gate electrode for enabling access to a memory cell which is a target to be accessed. The transistor formed of the selection gate 70 does not store data. In contrast, each of the control gates 50-1 and 50-2 is a gate electrode arranged on the charge storage layer and functions to control delivery of charges to and from the charge storage layer. The transistors respectively formed of the control gates 50-1 and 50-2 store data. That is, with the configuration shown in FIG. 9, two bits of data are stored. It is to be noted that a bit line BL and a source line SL are exchangeable depending on which bit of these two bits becomes a target to be written or to be read out.

In every modified example shown in FIGS. 7 to 9, a direction from the first N-type diffusion layer 21 to the second N-type diffusion layer 22 (the direction X) is the same as the crystal orientation <100> of the silicon crystal. The operations of writing or reading data are similarly achieved by the above-mentioned method. As a result, effects similar to the above-mentioned effects can be obtained.

The present invention has been described based on the above examples, but the present invention is not limited only to the above examples, and includes various kinds of alterations and modifications that could be achieved by a person skilled in the art within the scope of the invention of each of claims of this application as a matter of course.

Further, it is noted that, Applicant's intent is to encompass equivalents of all claim elements, even if amended later during prosecution

What is claimed is:

1. A nonvolatile semiconductor memory of an NMOS transistor type, comprising:
   first and second N-type diffusion layers formed in a P-type silicon layer as a source and a drain, a direction from the first N-type diffusion layer to the second N-type diffusion layer being the same as a crystal orientation <100> of the P-type silicon layer;
   a gate electrode formed on a channel region with an insulating film interposed therebetween, the channel region being sandwiched between the first and second N-type diffusion layers; and
   a charge storage layer formed in the insulating film to store electric charges, said charge storage layer being injected with a hot hole beyond a potential barrier of the insulating film, at a time of rewriting data.

2. The memory according to claim 1, wherein at the time of rewriting the data, a negative potential relative to a potential of the P-type silicon layer is applied to the gate electrode, and a positive potential relative to a potential of the P-type silicon layer is applied to at least one of the first and second N-type diffusion layers.

3. The memory according to claim 2, wherein at the time of rewriting the data, the positive potential is applied to both of the first and second N-type diffusion layers.

4. The memory according to claim 1, wherein a surface of the P-type silicon layer comprises a crystal plane (100).

5. The memory according to claim 1, wherein the charge storage layer comprises a floating gate.

6. The memory according to claim 5, wherein the floating gate is arranged so that the gate electrode partially overlaps the floating gate and a portion of the gate electrode is provided on the channel region via the insulating film.

7. The memory according to claim 1, wherein
   the insulating film comprises an oxide film and
   the charge storage layer comprises a nitride film.

8. The memory according to claim 1, further comprising a selection gate,
   wherein the charge storage layer is placed between the gate electrode and the channel region as well as between the gate electrode and the selection gate.

9. A nonvolatile semiconductor memory of an NMOS transistor type, comprising:
   first and second N-type diffusion layers formed in a P-type silicon layer as a source and a drain, a direction from the first N-type diffusion layer to the second N-type diffusion layer being the same as a crystal orientation <100> of the P-type silicon layer;
   a gate electrode formed on a channel region with an insulating film interposed therebetween, the channel region being sandwiched between the first and second N-type diffusion layers;
   a charge storage layer formed in the insulating film between the channel region and the gate electrode and having electric charges stored therein; and
   a potential applying unit which, at a time of rewriting data, applies a negative potential relative to a potential of the P-type silicon layer to the gate electrode and applies a positive potential relative to a potential of the P-type silicon layer, to at least one of the first and second N-type diffusion layers.

10. The memory according to claim 9, wherein at the time of rewriting the data, the potential applying unit applies the positive potential to both of the first and second N-type diffusion layers.

11. A method of operating a nonvolatile semiconductor memory, comprising:
   applying a negative potential relative to a potential of a P-type silicon layer to a gate electrode of a semiconductor memory cell, at a time of rewriting data; and
   at a same time as said applying, applying a positive potential relative to a potential of the P-type silicon layer, to at least one of first and second N-type diffusion layers of said semiconductor memory cell, a direction from the first N-type diffusion layer to the second N-type diffusion layer being the same as a crystal orientation <100> of the P-type silicon layer.

12. The method as claimed in claim 11,
   wherein said first and second N-type diffusion layers are formed in said P-type silicon layer as a source and a drain; and
   said gate electrode is formed on a channel region with an insulating film interposed therebetween and the channel region is sandwiched between the first and second N-type diffusion layers.

13. The method as claimed in claim 12, wherein said memory cell further comprises:
   a charge storage layer which is formed in the insulating film between the channel region and the gate electrode.

14. A method of operating a nonvolatile semiconductor memory, comprising:
   applying a negative potential relative to a potential of a P-type silicon layer to a gate electrode of a semiconductor memory cell, at a time of rewriting data; and
   at a same time as said applying, applying a positive potential relative to a potential of the P-type silicon layer, to at least one of first and second N-type diffusion layers of said semiconductor memory cell.

15. The method as claimed in claim 14, wherein at the time of rewriting, electrons flow in a direction from the first N-type diffusion layer toward the second N-type diffusion layer, and a direction in which the electrons flows is the same as the crystal orientation <100> of the P-type silicon layer.

* * * * *